(12) United States Patent
Krahn

(10) Patent No.: US 6,285,538 B1
(45) Date of Patent: *Sep. 4, 2001

(54) PARTIAL DISCHARGE COUPLER

(75) Inventor: John Raymond Krahn, Schenectady, NY (US)

(73) Assignee: General Electric Company, Schenectady, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/428,161

(22) Filed: Oct. 27, 1999

Related U.S. Application Data

(63) Continuation-in-part of application No. 08/970,464, filed on Nov. 14, 1997, now Pat. No. 5,991,137, which is a continuation-in-part of application No. 08/603,300, filed on Feb. 20, 1996, now abandoned.

(51) Int. Cl.$^7$ .................................................. H02H 3/00
(52) U.S. Cl. ........................ 361/87; 361/93.1; 361/104; 361/115
(58) Field of Search .................................. 361/104, 93.1, 361/115, 118, 87

(56) References Cited

U.S. PATENT DOCUMENTS

| | | | |
|---|---|---|---|
| 3,467,934 | 9/1969 | Innis et al. ........................... | 337/144 |
| 3,723,930 | 3/1973 | Koch .................................... | 337/158 |
| 3,973,169 | 8/1976 | Titus .................................... | 317/12 B |
| 4,012,579 | 3/1977 | Fox et al. ........................... | 174/52 PE |
| 4,148,003 | 4/1979 | Colburn et al. ...................... | 333/181 |
| 4,329,273 | 5/1982 | Hardman et al. ..................... | 524/862 |
| 4,331,948 | 5/1982 | Malinaric et al. ..................... | 338/21 |
| 4,514,276 | 4/1985 | Covington et al. ................... | 204/415 |
| 4,757,423 | 7/1988 | Franklin ............................... | 361/275 |
| 4,779,051 | 10/1988 | Grunewald et al. .................. | 324/536 |
| 4,931,899 | 6/1990 | Pruett .................................. | 361/308 |
| 5,173,766 | 12/1992 | Long et al. .......................... | 257/687 |
| 5,364,913 | 11/1994 | Meltzer et al. ....................... | 525/440 |
| 5,386,193 | 1/1995 | Maeda et al. ........................ | 324/547 |
| 5,583,740 | * 12/1996 | Fujino ................................. | 361/534 |
| 5,991,137 | * 11/1999 | Krahn et al. ........................ | 361/104 |

* cited by examiner

Primary Examiner—Stephen W. Jackson
(74) Attorney, Agent, or Firm—Ann M. Agosti; Jill M. Breedlove

(57) ABSTRACT

A partial discharge (PD) coupler for coupling electrical machinery to partial discharge analysis testing equipment includes at least one capacitor capable of withstanding high voltages; a current sensor for sensing current passed by the at least one capacitor; and potting material surrounding the at least one capacitor and the current sensor for providing flashover protection.

5 Claims, 2 Drawing Sheets

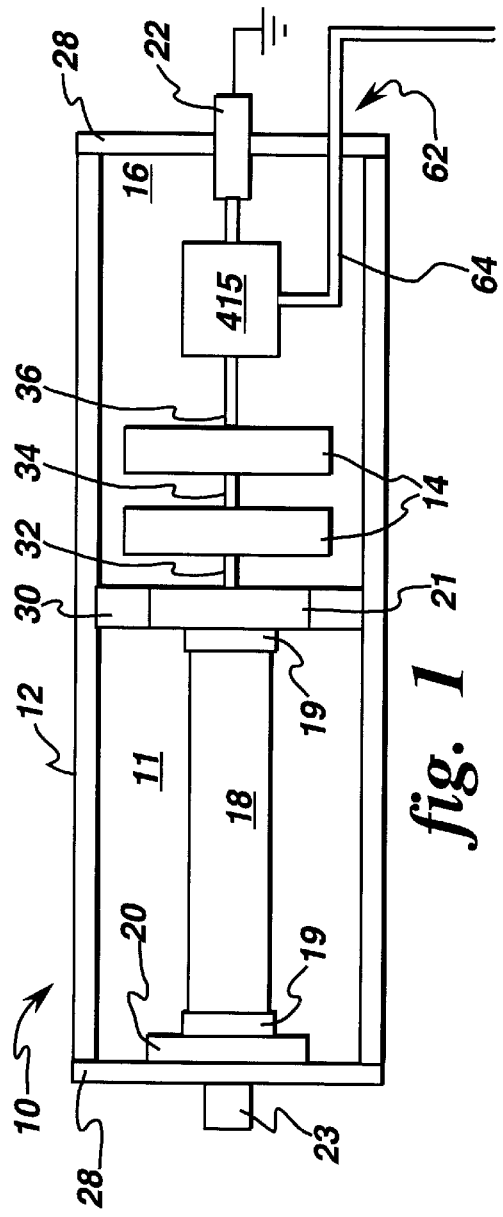
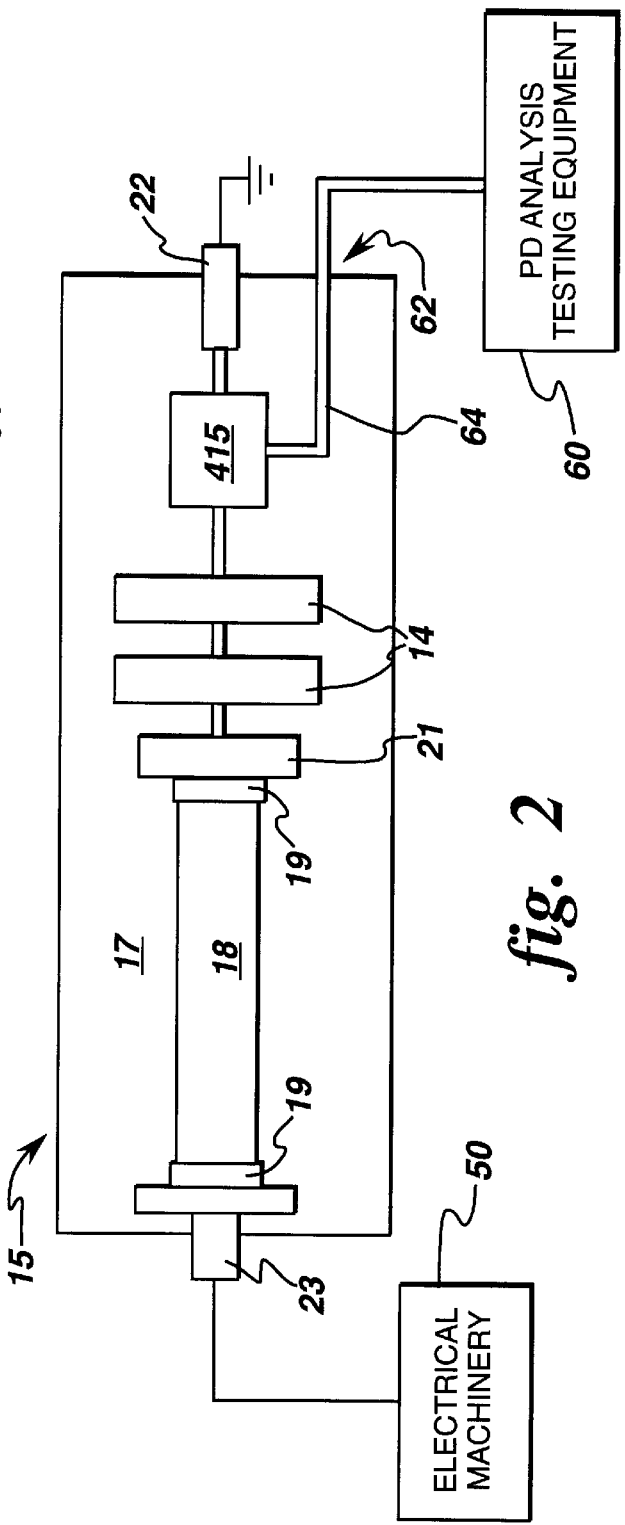

PARTIAL DISCHARGE COUPLER

CROSS REFERENCE TO RELATED APPLICATIONS

This application is a continuation-in-part of commonly assigned Krahn et al., U.S. application Ser. No. 08/970,464, filed Nov. 14, 1997, now U.S. Pat. No. 5,991,137, which is a continuation-in-part of Krahn et al., U.S. application Ser. No. 08/603,300, filed Feb. 20, 1996, now abandoned.

BACKGROUND OF THE INVENTION

Couplers which are installed on electrical machinery, such as generators, motors, or transformers, for diagnosing the condition of machinery insulation must accurately extract the required electrical signals without compromising machinery performance or degrading the signals of interest. For coupling partial discharge analysis (PDA) testing equipment with electrical machinery, a convenient technique is coupling off the ground-strap to a surge capacitor used for protecting the equipment against extraneous surges from sources such as lightning. Surge capacitors are generally oil-filled capacitors which have the potential of creating a fire or explosion. Most oil-filled surge capacitors are not sufficiently corona-"free", and therefore the capacitor itself can create discharges which must be considered when analyzing the data. The oil-filled surge capacitors that are designed to be corona-free are expensive. Many installations do not have surge capacitors and suitable capacitors must be installed. As these capacitors are continuously energized, they must be reliable so that they do not affect the integrity of the system. Surge capacitors generally attenuate and do not sufficiently pass high frequency signals.

In aforementioned Krahn et al., U.S. application Ser. No. 08/970,464, a partial discharge (PD) coupler for coupling electrical machinery to partial discharge analysis testing equipment includes at least one capacitor capable of withstanding high voltages; potting material surrounding the at least one capacitor for providing flashover protection; and a fuse for protecting the electrical machinery, the fuse physically and electrically connected in series to the at least one capacitor, the at least one capacitor and the fuse capable of passing high frequency partial discharges from the electrical machinery to the partial discharge analysis testing equipment with minimal attenuation. The potting material may include an elastomeric or thermoset material and in one embodiment comprises silicone. The PD coupler can have potting material surrounding both the capacitors and the fuse. The PD coupler can include a housing surrounding the capacitors, the potting material, and the fuse. This embodiment provides an efficient method and a corona-free apparatus for inexpensively providing safe and effective connection of partial discharge equipment to electric devices.

SUMMARY OF THE INVENTION

It would be useful to further improve the above-discussed design by reducing manufacturing costs and associated hardware with partial discharge couplers.

Briefly, according to one embodiment of the present invention, a partial discharge (PD) coupler for coupling electrical machinery to partial discharge analysis testing equipment includes at least one capacitor capable of withstanding high voltages; a current sensor for sensing current passed by the at least one capacitor; and potting material surrounding the at least one capacitor and the current sensor for providing flashover protection.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIG. 1 is a block diagram of one embodiment of a partial discharge coupler of the present invention.

FIG. 2 is a block diagram of another embodiment of a partial discharge coupler of the present invention.

DETAILED DESCRIPTION OF THE PREFERRED EMBODIMENTS OF THE INVENTION

Figure 3:
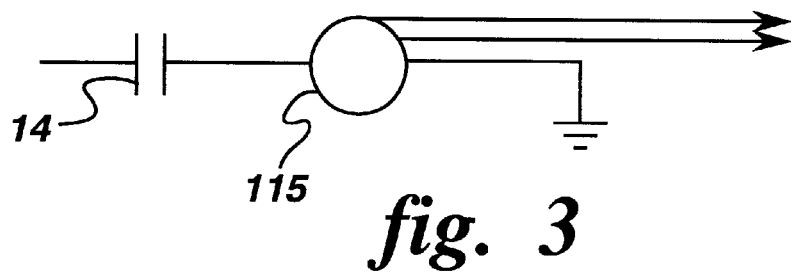
FIGS. 3–5 are block diagrams of current sensor embodiments that can be used in the embodiments of FIGS. 1–2.

FIG. 1 is a block diagram of one embodiment of a partial discharge (PD) coupler 10 of the present invention. PD coupler 10 comprises one or more high voltage capacitors (shown as two capacitors 14) coupled in series, potting material 16 surrounding the capacitors, and a current sensor 415 coupled for sensing current passed by the capacitors. In a preferred embodiment, as shown, fuse 18 is additionally coupled in series to the capacitors.

The capacitor comprises a capacitor that is capable of withstanding high voltage conditions, preferably even without the addition of potting material. The amount of voltage a particular capacitor will need to be able to withstand will depend on the embodiment in which it will be used. For example, in some embodiments a capacitor able to operate up to the four kilovolts to 30 kilovolts range will be sufficient, and in other embodiments a capacitor should be capable of operation up to 765 kilovolts.

In addition to being able to operate under high voltage conditions, capacitor 14 is also capable of passing high frequency transient signals. Again, the level of frequency passing capabilities needed by a capacitor will depend on its planned use. For example, in some embodiments a capacitor will need to pass signals up to 100 megahertz, and in other applications the signals of interest may be in the gigahertz range.

In one embodiment of the present invention, to meet the high voltage and high frequency objectives, the capacitors comprise a ceramic material such as a glass or a metal oxide. Other types of appropriate capacitor materials may include liquid-impregnated metallized polymer film capacitors and mica insulated capacitors. Preferably the capacitors are cylindrically-shaped.

The PD coupler passes high frequency transient signals from electrical machinery (represented by block 50 in FIG. 2). The high frequency signals are then collected by a current sensor 415 on the ground side of the capacitors for analysis by PD analysis testing equipment (represented by block 60 in FIG. 2). Such high frequency transients are subsequently evaluated to monitor the condition of the machine. For low-cost applications, a plurality of capacitors (preferably two) having low resistance connections can be used to multiply the voltage-handling capabilities of individual capacitors.

For example, in one embodiment, two 1300 picofarad capacitors each rated at 16 kVAC (kilovolts alternating current) are used to provide a cumulative rating of 32 kVAC.

These capacitors can be electrically and physically connected with a low resistance connection comprising a screw 34, for example. In another embodiment, contact between the capacitors can be made by contacting their electrodes over the full diameter of the capacitor plates to conserve space.

Figure 4:
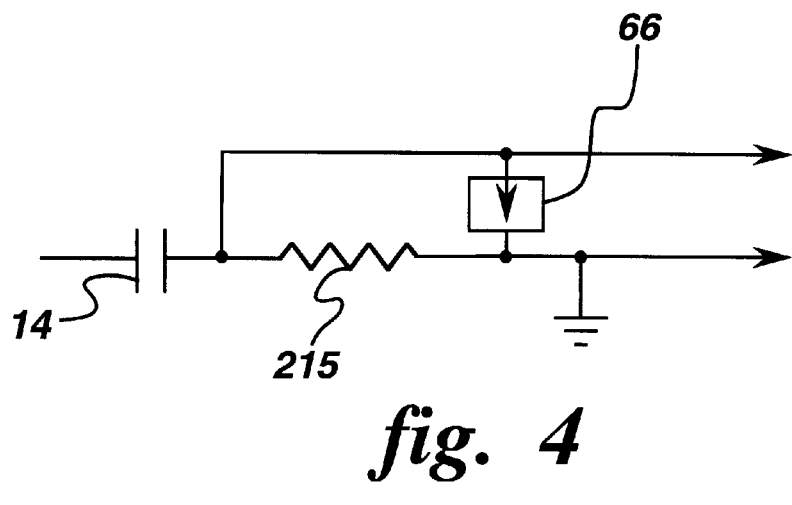
Figure 5:
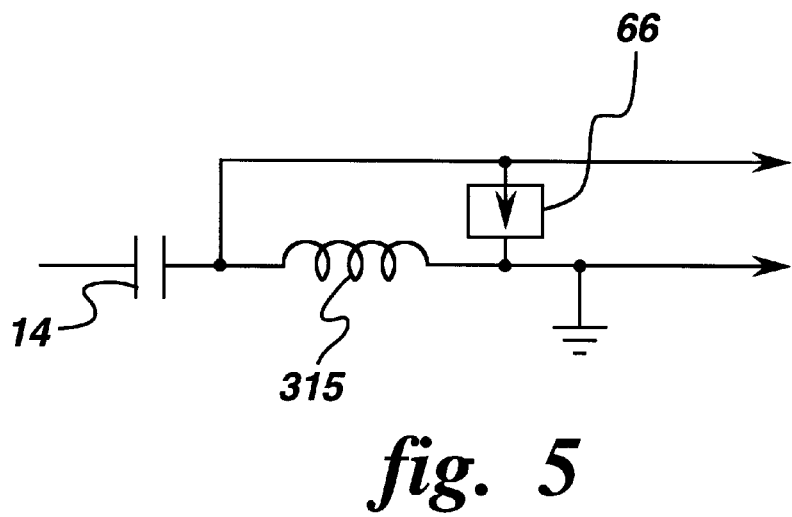

Current sensor 415 may comprise a current transformer (115 in FIG. 3) or a resistor (215 in FIG. 4) or an inductor (315 in FIG. 5) which is coupled in series between the capacitor and ground, for example. One advantage of a current transformer is that it is not directly coupled in series with capacitor 14 but rather is situated around the connection between the capacitor and ground. By potting the current sensor with the capacitor, manufacturing costs are lower and less additional hardware is required for the partial discharge sensor. The result is easier, faster, more robust installations at reduced cost.

If a current transformer is used for current sensor 415, in one embodiment the current transformer comprises a high frequency current transformer for passing currents having frequency in the range of about 100 kilohertz to about 100 megahertz, for example. For resistor-type current sensors, typical resistance values range from about 1 kilo ohm to about 100 kilo ohms. For inductor-type current sensors, low frequency inductors are useful for producing a potential difference. For the embodiments of FIGS. 4 and 5, a spark-gap 66 may be placed in parallel with the resistor 215 or inductor 315 to provide over-voltage protection to the PD analysis testing equipment 60.

Fuse 18 may comprise a line-rated, high voltage fuse, and in one embodiment is a 0.5 ampere fuse. The fuse should also be capable of passing high frequency transient signals with minimal attenuation. In a preferred embodiment, the series combination of the capacitor and fuse passes high frequency signals with attenuation on the order of less than or equal to about five percent, for example.

Typically the fuse has two fuse caps 19. The fuse is used to isolate the circuit in the event of a capacitor failure and thereby limit the capacitor fault or short circuit current from damaging the attached electrical machinery. Depending on the available short circuit current, a current limiting device (not shown) of either a resistive or a reactive type, for example, may be needed in series with the fuse. One side of the fuse can be connected through its fuse cap 19 and a fuse end contact 21 to the capacitors 14 by a low resistance contact such as a screw 32.

During basic impulse level (BIL) testing, potting material 16 provides flashover prevention which is important because any arcing, sparking, or degradation constitutes a failure and because of the possibility that an unexpected lightning (impulse) wave may strike the machine.

The potting material may comprise any insulative material capable of being potted, such as an elastomeric or thermoset material, and capable of withstanding the voltages of the capacitors. The use of an elastomeric material is particularly useful in order to accommodate changes of thermal expansion. Examples of appropriate potting materials include, for example, silicones, polyurethanes, polyesters, ethylene propylene rubbers (EPRs), ethylene propylene dimers (EPDMs), elastomers, fluorocarbons, and perfluorocarbons. Preferably the potting material is track resistant.

In one embodiment, the potting material comprises de-gassed silicone RTV (room temperature vulcanization) supplied by the General Electric Company, Waterford, N.Y. under the product number RTV-6136 A&B. Other appropriate types of silicon include low viscosity silicone fluids, high viscosity silicone polymers, and gelatinous silicone polymers. The use of a silicone potting material is non-flammable in contrast to conventional oil-filled capacitors, and thus provides for enhanced safety of the PD coupler, especially when ceramic capacitors are used.

The PD coupler can include a housing 12 surrounding the capacitors, current sensor, the potting material, and, if desired, the fuse. In one embodiment, the housing includes a polycarbonate tube with two polycarbonate housing end caps 28. Each housing end cap may include a mounting terminal 22 or 23. Mounting terminal 22 is not necessarily used in embodiments wherein the end cap itself is bolted or otherwise coupled to ground such that there is a good electrical connection to ground. Current sensor leads 64 can be coupled to PD analysis testing equipment 60 (FIG. 2) through an opening 62 in housing 12, for example. Opening 62 is sufficiently small such that minimal potting material escapes during molding.

In one embodiment, mounting terminal 22 comprises aluminum connected to capacitors 14 via a screw 36 and mounting terminal 23 comprises copper. Mounting terminal 23 can be connected to the electrical machinery to be analyzed. Mounting terminal 22 can be connected to electrical ground. Preferably, a fuse end contact 20 is present between mounting terminal 23 and a fuse cap 19. Electric field enhancement is minimized when each of the caps, contacts, and terminals 19, 20, 21, 22, and 23 have rounded edges. The housing material can be track resistant and contoured to increase the surface creepage distance to provide more reliability under adverse environmental conditions, such as high humidity. The area 11 between the fuse and the housing typically comprises air but can include potting material for the fuse, if desired.

In one embodiment, fuse end cap 21 is surrounded with a tape 30 having a thickness sufficient to create a tight fit of fuse end cap 21 in housing 12. The fuse and capacitors are inserted in the housing, and then the potting material is poured around the capacitors with the tape acting to prevent significant leakage of potting material into the fuse area. Preferably the potting material is supplied in such a manner that bubbles are not significantly present in the finished PD coupler.

To improve adhesion between the capacitor-potting material surface and/or the housing-potting material surface, a bonding agent such as a space-age acrylate, for example, can be applied to the capacitors and/or the housing prior to the application of the potting material.

For most effective operation, the PD coupler, and particularly the capacitors, should be corona-free to a level suitable for the particular application. In an experiment a PD coupler was fabricated with two 1300 picofarad capacitors each rated at 16 kVAC, a 0.5 ampere fuse, de-gassed silicone RTV potting material, and a polycarbonate tube housing with two polycarbonate end caps. The coupler was tested and maintained a BIL rating of 142 kilovolts, making it suitable for even high voltage generators such as those rated to 22 kilovolts. It is expected that higher BIL ratings can be obtained by using more capacitors in series.

The fuse is not an essential element of the invention. In some applications the fuse will be integral to the partial discharge coupler and in other applications, the fuse will be not be included in the design or will be added during installation. In one embodiment, two capacitors and a current sensor comprising a current transformer were encapsulated in a cycloaliphatic epoxy that was filled with ground quartz filler (particles of about 5 micrometers in diameter and about 13% weight of the potting material) to create opaque potting material.

FIG. 2 is a block diagram of another embodiment of a partial discharge coupler 15 of the present invention. As shown in FIG. 2, housing 12 of FIG. 1 is optional and is not required, for example, when the entire capacitor-fuse assembly is potted. Potting material 17 can be used to hold the elements in their proper positions. Appropriate potting materials include thermoset materials such as epoxies and polyesters, and elastomeric materials such as polyurethanes, EPRs, EPDMs, silicones, perfluorocarbons, and fluorocarbons. Thermoset materials are useful for maintaining rigidity. In a hybrid embodiment, the portion of the potting material surrounding the capacitors and the current sensor comprises an elastomeric material, whereas the portion of the potting material surrounding the fuse comprises a thermoset material.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A partial discharge (PD) coupler for coupling electrical machinery to partial discharge analysis testing equipment, the PD coupler comprising:

at least one capacitor capable of withstanding high voltages;

a current sensor for sensing current passed by the at least one capacitor; and potting material surrounding the at least one capacitor and the current sensor for providing flashover protection.

2. The coupler of claim 1 wherein the current sensor is a current transformer, a resistor, or an inductor.

3. A partial discharge (PD) coupler for coupling electrical machinery to partial discharge analysis testing equipment, the PD coupler comprising:

at least one capacitor capable of withstanding high voltages;

a fuse for protecting the electrical machinery, the fuse physically and electrically connected in series to the at least one capacitor, the at least one capacitor and the fuse capable of passing high frequency partial discharges with minimal attenuation; a current sensor for sensing current passed by the at least one capacitor; and potting material surrounding the at least one capacitor, the fuse, and the current transformer.

4. The coupler of claim 3 wherein the current sensor is a current transformer, a resistor, or an inductor.

5. A partial discharge (PD) coupler for coupling electrical machinery to partial discharge analysis testing equipment, the PD coupler comprising:

at least one ceramic capacitor capable of withstanding high voltages;

a fuse for protecting the electrical machinery, the fuse physically and electrically connected in series to the at least one capacitor, the at least one capacitor and the fuse capable of passing high frequency partial discharges with minimal attenuation;

a current transformer for sensing current passed by the at least one capacitor; and potting material surrounding the at least one capacitor, the fuse, and the current transformer.

* * * * *